(12) United States Patent
Okita et al.

(10) Patent No.: US 8,134,190 B2
(45) Date of Patent: Mar. 13, 2012

(54) IMAGE PICKUP APPARATUS AND IMAGE PICKUP SYSTEM

(75) Inventors: Akira Okita, Yamato (JP); Masanori Ogura, Atsugi (JP); Seiichiro Sakai, Zama (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 12/390,836

(22) Filed: Feb. 23, 2009

(65) Prior Publication Data

US 2009/0159945 A1 Jun. 25, 2009

Related U.S. Application Data

(62) Division of application No. 11/212,630, filed on Aug. 29, 2005, now Pat. No. 7,514,732.

(30) Foreign Application Priority Data

Sep. 1, 2004 (JP) ................................. 2004-254360

(51) Int. Cl.
  *H01L 27/146* (2006.01)
(52) U.S. Cl. ........ 257/292; 257/233; 257/291; 257/461; 257/462; 257/E27.133
(58) Field of Classification Search ................... 257/233, 257/291, 292, 461–465, E25.032, E27.133
  See application file for complete search history.

(56) References Cited

U.S. PATENT DOCUMENTS 4,663,669 A   5/1987   Kinoshita et al. ........ 358/213.19

(Continued)

FOREIGN PATENT DOCUMENTS

EP   1 017 106 A2   7/2000

(Continued)

OTHER PUBLICATIONS

A. Yusa et al., "SIT Image Sensor: Design Considerations and Characteristics," *IEEE Transactions on Electron Devices*, vol. ED-33, No. 6, pp. 735-742 (Jun. 1986).

(Continued)

*Primary Examiner* — Ha Tran T Nguyen
*Assistant Examiner* — Suberr Chi
(74) *Attorney, Agent, or Firm* — Fitzpatrick, Cella, Harper & Scinto (57) ABSTRACT

To provide a solid-state image pickup apparatus with little or no difference in the dark currents between adjacent photoelectric conversion elements and providing a high sensitivity and a low dark current even in a high-speed readout operation.

A well 302 is formed on a wafer 301, and semiconductor layers 101*a*, 101*b* are formed in the well to constitute photodiodes. A well contact 306 is formed between the semiconductor layers 101*a*, 101*b*. Element isolation regions 303*b*, 303*a* are provided between the well contact and the semiconductor layers, and channel stop layers 307*b*, 307*a* are provided under the element isolation regions 303*b*, 303*a*. A conductive layer 304 is provided on the element isolation region 303*b*, and a side wall 308 is provided on a side face of the conductive layer 304. A distance a between an end of the element isolation region 303*b* and the conductive layer 304, a width b of the side wall 308 and a device isolation width c satisfy a relation c>a≧b.

11 Claims, 8 Drawing Sheets

U.S. PATENT DOCUMENTS

| | | | |
|---|---|---|---|
| 4,774,585 A | 9/1988 | Suga et al. | 358/213.19 |
| 4,780,764 A | 10/1988 | Kinoshita et al. | 358/213.19 |
| 4,821,105 A | 4/1989 | Suga et al. | 358/213.19 |
| 4,929,994 A | 5/1990 | Matsumoto | 357/30 |
| 5,121,225 A | 6/1992 | Murata et al. | 358/471 |
| 5,188,975 A | 2/1993 | Kojima et al. | 437/48 |
| 5,261,013 A | 11/1993 | Murata et al. | 382/65 |
| 5,475,211 A | 12/1995 | Ogura et al. | 250/208.1 |
| 5,898,204 A | 4/1999 | Watanabe | 257/349 |
| 6,147,373 A | 11/2000 | Moon | 257/233 |
| 6,255,705 B1 | 7/2001 | Zhang et al. | 257/412 |
| 6,657,665 B1 | 12/2003 | Guidash | 348/308 |
| 6,731,337 B2 | 5/2004 | Watanabe | 348/308 |
| 6,774,453 B2 | 8/2004 | Okita | 257/506 |
| 6,906,364 B2 * | 6/2005 | Chen et al. | 257/292 |
| 7,016,089 B2 | 3/2006 | Yoneda et al. | 358/482 |
| 2002/0190288 A1 | 12/2002 | Lee et al. | 257/292 |
| 2004/0141077 A1 | 7/2004 | Ohkawa | 348/308 |
| 2004/0147068 A1 | 7/2004 | Toyoda et al. | 438/197 |
| 2005/0098805 A1 | 5/2005 | Okita et al. | 257/292 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0269604 A1 | 12/2005 | Koizumi et al. | 257/291 |
| 2006/0027843 A1 | 2/2006 | Ogura et al. | 257/291 |
| 2006/0043261 A1 | 3/2006 | Matsuda et al. | 250/208.1 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0061674 A1 | 3/2006 | Iida et al. | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |

FOREIGN PATENT DOCUMENTS

| | | |
|---|---|---|
| JP | 2000-232216 | 8/2000 |
| JP | 2001-230400 | 8/2001 |
| JP | 2001-332714 | 11/2001 |

OTHER PUBLICATIONS

N. Tanaka et al., "A 310K Pixel Bipolar Imager (BASIS)," *IEEE Transactions on Electron Devices*, vol. 37, No. 4, pp. 646-652 (Apr. 1990).

Nakamura et al., "Amplified solid-state image element AMI (Amplified MOS Intelligent Image)," Bulletin of Television Society, vol. 41, No. 11, pp. 1-75-1082 (Nov. 1987).

* cited by examiner

IMAGE PICKUP APPARATUS AND IMAGE PICKUP SYSTEM

CROSS REFERENCE TO RELATED APPLICATION

This application is a division of U.S. application Ser. No. 11/212,630, filed Aug. 29, 2005, now U.S. Pat. No. 7,514,732 the entire disclosure of which is hereby incorporated by reference herein.

BACKGROUND OF THE INVENTION

1. Field of the Invention

The present invention relates to an image pickup apparatus and a system utilizing the same, and more particularly to an image pickup apparatus and a system such as a digital camera, a video camera, a copying apparatus, and a facsimile apparatus.

2. Background of the Invention

A solid-state image pickup apparatus formed by a one- or two-dimensional array of photoelectric conversion elements such as photodiodes is widely employed in a digital camera, a video camera, a copying apparatus, a facsimile apparatus and the like. The solid-state image pickup apparatus includes a CCD image pickup device and an amplifying solid-state image pickup apparatus represented by a CMOS sensor which is formed integrally with peripheral circuits by a CMOS process.

Such solid-state image pickup apparatus shows a trend toward a larger number of pixels, with a decrease in the area of a photodiode, as a result of a reduction in the area of a pixel. It is therefore required to handle a signal charge of a smaller amount, and it is therefore required to reduce a dark current constituting a noise component, and to increase an effective area of the photodiode. For such purpose, EP 1017106A1 discloses in FIG. 4 (corresponding to Japanese Patent Application Laid-open No. 2000-232216) a configuration in which floating diffusion regions formed for every pixels are connected by a conductor, and in which the signal reading is executed by an amplification by a common amplifying MOS transistor, thereby reducing a number of transistors per unit pixel and maintaining the area of the photodiode larger.

Also when the solid-state image pickup apparatus becomes larger in the area, it becomes necessary, as disclosed in Japanese Patent Application Laid-open No. 2001-332714 (FIGS. 7 and 10) or Japanese Patent Application Laid-open No. 2001-230400 (FIGS. 1 and 16, corresponding to US 2001-1012133A) to form a well contact in order to obtain a firm substrate potential for the photodiode and the transistor and to suppress a shading phenomenon.

Also a fine structuring of the MOS transistors is essential in the image pickup device or in the peripheral circuits, there is widely employed a transistor having so-called LDD (lightly doped drain) structure.

In the aforementioned image pickup apparatus, in case of forming a well contact between the photodiodes, a element isolation region is formed for a device isolation between the well contact and the photodiode. Then a conductive layer for example of polysilicon is formed thereon, and a side wall may be formed in such conductive layer, in relation to the preparation of a transistor of an LDD structure.

The present invention has found a drawback of an increased dark current of the photodiode, depending on the arrangement of the side wall.

SUMMARY OF THE INVENTION

The present invention has been made in consideration of the aforementioned drawback.

The present invention provides an image pickup apparatus including a photoelectric conversion element which has a first semiconductor region of a first conductive type, and a second semiconductor region of a second conductive type constituting a junction with the first semiconductor region, a third semiconductor region of a first conductive type, provided in the first semiconductor region for fixing a potential of the first semiconductor region at a predetermined potential, a element isolation region provided between the third semiconductor region and the second semiconductor region, a conductive layer provided on the element isolation region, and a fourth semiconductor region of the first conductive type provided under the element isolation region:

wherein the conductive layer includes a side wall at a lateral face thereof, and a width c of the element isolation region, a width b of the side wall and a distance a between an end of the element isolation region at the side of the third semiconductor region and an end of the conductive layer at the side of the third semiconductor region satisfy a relation $c > a \geq b$.

The present invention also provides an image pickup apparatus including a photoelectric conversion element which has a first semiconductor region of a first conductive type, and a second semiconductor region of a second conductive type constituting a junction with the first semiconductor region, a third semiconductor region of a first conductive type, provided in the first semiconductor region for fixing a potential of the first semiconductor region at a predetermined potential, a element isolation region provided between the third semiconductor region and the second semiconductor region, a conductive layer provided on the element isolation region, and a fourth semiconductor region of the first conductive type provided under the element isolation region:

wherein the conductive layer includes a side wall at a lateral face thereof, and the side wall is provided on the element isolation region in such a manner that an external end of the side wall does not exceed an end of the element isolation region.

An image pickup system of the present invention utilizes the aforementioned image pickup apparatus of the invention.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

In the following, embodiments of the present invention will be explained in detail with reference to the accompanying drawings.

Figure 1:
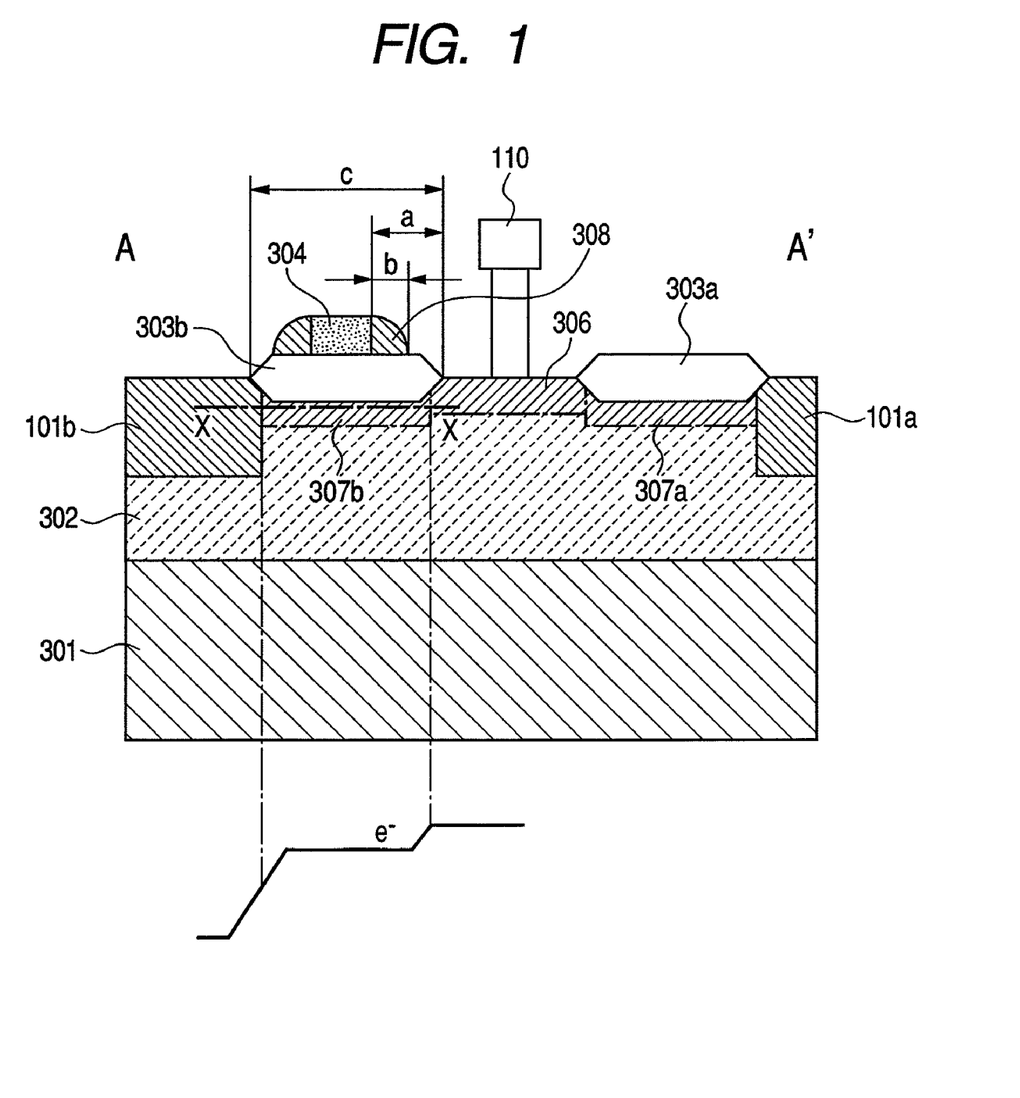
FIG. 1 is a cross-sectional view of an embodiment of a photoelectric conversion apparatus and of a first example of a solid-state image pickup apparatus of the present invention.
Figure 2:
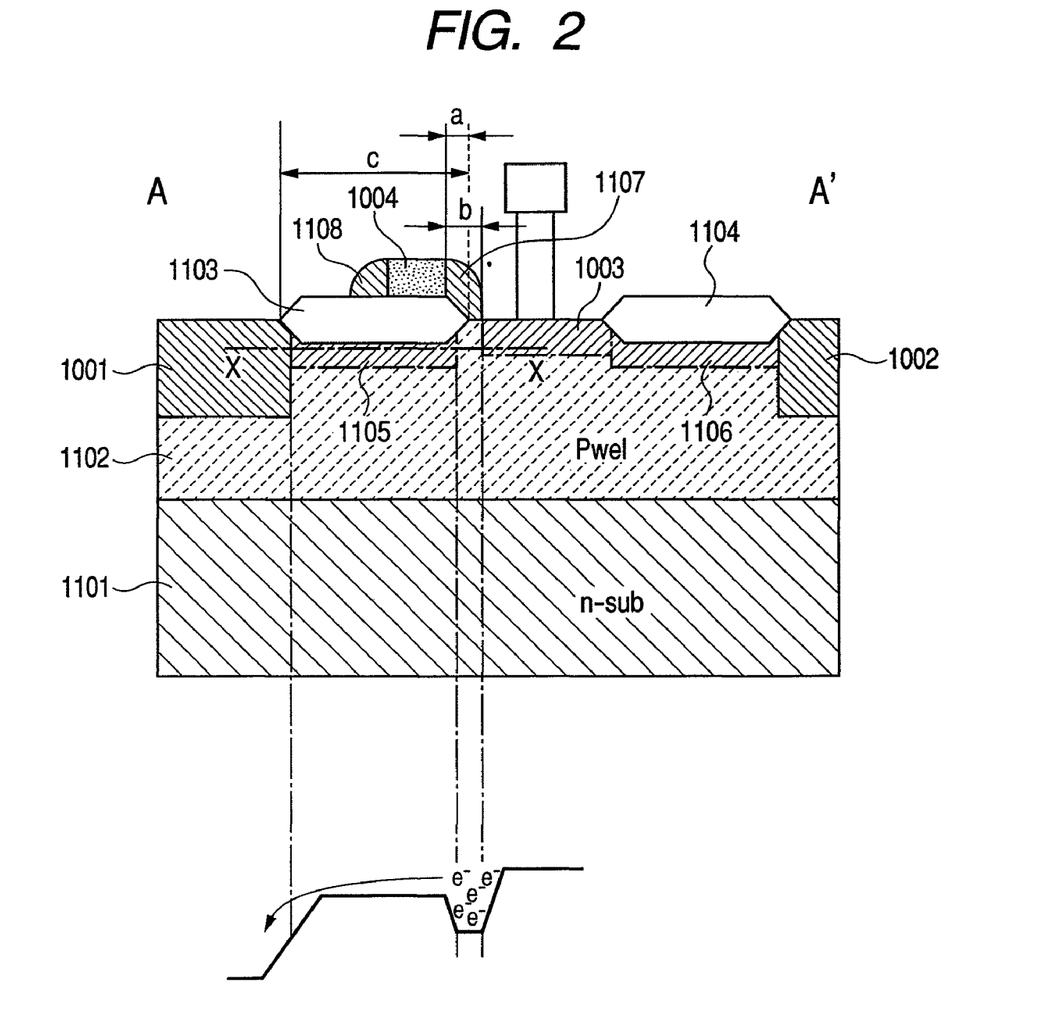
FIG. 2 is a cross-sectional view of comparative examples of a photoelectric conversion apparatus and a solid-state image pickup apparatus of the present invention.

FIG. 1 is a cross-sectional view showing an embodiment of a photoelectric conversion apparatus of the present invention. FIG. 2 is a cross-sectional view showing a comparative example relating to the present invention.

In FIG. 1, there are shown a semiconductor substrate 301 for example of N type; a P-type well (first semiconductor region of first conductive type) 302; and N-type semiconductor regions (second semiconductor regions of second conductive type) 101a, 101b capable of accumulating a signal charge and forming junctions with the well 302 to constitute photodiodes. A well contact 110 defines a potential of the P-type well 302 through a $P^{++}$-semiconductor region 306 (third semiconductor region of a first conductive type). The semiconductor region 306 has an impurity concentration higher than that of the P-type well. Element isolation regions 303b, 303a are formed for example by a LOCOS (local oxidation of silicon) film. Under the element isolation regions 303b, 303a, there are respectively provided $P^+$-semiconductor regions (fourth semiconductor region of first conductive type) constituting channel stop regions. A conductive layer 304 provided on the element isolation region 303b is formed for example with polysilicon. A so-called side wall 308 for example of a silicon oxide film is formed on a lateral face of the conductive layer. Terms "upper" and "lower" mean, with respect to a principal plane, bearing devices, of the semiconductor substrate, a deeper direction of the substrate as "lower" and an opposite direction as "upper".

The contact is represented as a well contact, but it becomes a substrate contact in case N-type semiconductor regions 101a, 101b are provided directly on the wafer.

Referring to FIG. 2, a P-type well 1102 is provided on an n-type substrate 1101, and N-type semiconductor regions 1001, 1002 constituting photodiodes with the well 1002 are provided therein. Also a semiconductor region ($P^{++}$ region) 1003 for a well contact of a high concentration is formed so as to be positioned between element isolation regions 1103 and 1104. Under the element isolation regions, there are respectively provided $P^+$ type semiconductor regions 1105, 1106 constituting channel stop regions. Also on both sides of a polysilicon wiring 1005 on the element isolation region 1103, side walls 1107, 1108 are provided.

As will be apparent from a comparison of FIG. 2 showing a comparative example and FIG. 1 showing an embodiment of the present invention, the semiconductor region 1003 of the well contact and the channel stop region 1105 are mutually separated in FIG. 2, while, in FIG. 1, the semiconductor region 306 of the well contact is in connection or in contact with the channel stop region 307b. A term "connection" or "contact" means an absence, between the semiconductor region 306 and the channel stop region 307b, of a region of a lower potential, for a charge (electron in this case), than in the peripheral area. Stated differently, it means an absence of a region of a lower concentration of a P-type impurity than in the peripheral area, namely an N-type semiconductor region. In the foregoing there has been explained a relation between a semiconductor region of a well contact and a channel stop region, but such relation is not limited to a well contact and a similar relation applies a region of a same conductive type as in the peripheral well region and having a higher impurity concentration.

On the other hand, in the configuration shown in FIG. 2, a P-type well layer is present in a path from the high-concentration $P^{++}$ region 1003 through the channel stop region 1105 to the N-type semiconductor region 1001. Therefore, as indicated by a potential distribution in a portion X-X' in FIG. 2, electrons constituting the minority carriers are present at a higher concentration in this portion, than in other regions. A part of such electrons may be fetched in the photodiode of a low potential, thereby resulting in an increased dark current.

In the configuration shown in FIG. 1, in contrast, a $P^+$ region of a high concentration is maintained from the high-concentration $P^{++}$ region 306 through the channel stop region 307b to the N-type charge accumulation region 101b. Therefore, as indicated by a potential distribution in a portion X-X' in FIG. 1, electrons constituting the minority carriers can be maintained at a low concentration, thereby allowing to reduce the dark current.

In order to avoid a potential pocket as shown in FIG. 2, namely a region of a lower potential for electrons than in the peripheral area, there is preferred a following configuration. As shown in FIG. 1, a distance a between an end of the element isolation region 303b at the side of the $P^{++}$ region 306 and an end of the conductive layer 304 at the side of the $P^{++}$ region 306 is made same as or larger than a width b of the side wall 308. This is based on a fact that the potential pocket is generated because, in the processing forming the semiconductor region 1003 in the well shown in FIG. 2, an ion implantation into the $P^{++}$ region has not been executed in the portion of the potential pocket by the presence of the previously formed side wall. Also the distance a is required to be smaller than a device isolating width c, in order to form the conductive layer 304 thereon. Based on the foregoing, a, b and c are required to meet a relation $c > a \geq b$. Such structure can be also represented as a structure in which the side wall is present on the element isolation region and an external end of the side wall does not exceed an end of the element isolation region.

On the other hand, in the configuration shown in FIG. 2, the distance a is smaller than the device isolation width c and is formed on the element isolation region, but is smaller than the width b of the side wall, thereby resulting in a formation or a potential pocket, thus increasing the dark current.

The present embodiment is particularly effective in an image pickup apparatus in which plural pixels are arranged one- or two-dimensionally, because the presence of a well contact commonly used for plural pixels leads to pixels showing an increased dark current and those not showing such increase in periodical manner (every other row in case of the well contact common for two pixels, and in every four rows in case of the well contact common for four pixels), thereby significantly deteriorating the image quality. The aforementioned condition $c > a \geq b$ allows to provide an image pickup apparatus of a high S/N ratio.

In FIG. 1 there has been explained a configuration in which the conductive layer 304 is provided on the element isolation region 303b, but the present invention is applicable also to a case where a conductive layer 304 is provided also on the element isolation region 303a to realize a configuration satisfying a condition $c > a \geq b$, namely that the side wall is provided on the element isolation region and the external end of the side wall is so provided as not to exceed the end of the element isolation region.

Figure 3:
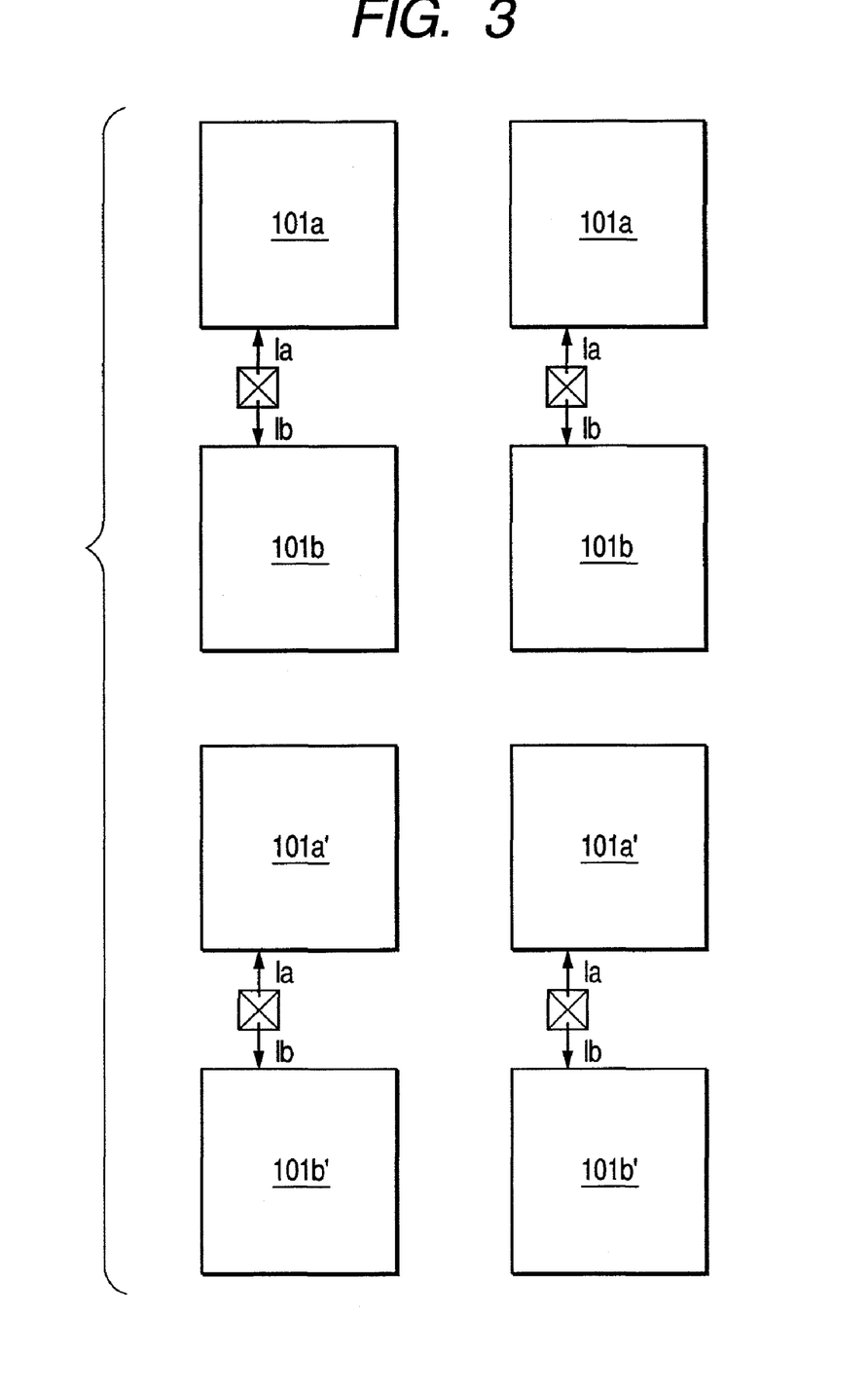
FIG. 3 is a plan view of an embodiment of a solid-state image pickup apparatus of the present invention.

As shown in FIG. 3, semiconductor regions 101a, 101b constituting pixel photodiodes are arranged two-dimensionally in such a manner that two pixels constitute a group (101a and 101b, 101a' and 101b' respectively constituting groups), and a well contact is provided for every two pixels (for every group) and between pixels (within the group). In such configuration, in case of a structure as shown in FIG. 2, amounts of minority carriers Ib flowing from the well contacts into the photodiodes 101b, 101b' of second and fourth rows becomes larger than those of minority carriers Ia flowing from the well contacts into the photodiodes 101a, 101a' of first and third rows. Such difference in the diffusion of the minority carriers leads to a difference in the mounts of the minority carriers Ia and the minority carriers Ib, thereby resulting in an unevenness in the dark current between the odd rows and the even rows. Such difference causes a stripe-shaped noise in every other row, thereby deteriorating the image quality. This phenomenon becomes particularly conspicuous in case of a charge accumulation for plural seconds. The configuration of the present invention allows to prevent formation of a potential pocket, thereby reducing the difference in the dark current.

FIG. 3 shows a configuration in which two pixels constitute a group, but three or more pixels may form a group. In such case, the well contact may be provided in plural units within a group, according to a number of pixels constituting a group.

The present embodiment of the invention is advantageously applicable to an image pickup apparatus in which signal charges from plural photoelectric conversion elements are amplified and read, through FD regions independently formed for respective photoelectric conversion elements, by a common amplifying MOS transistor.

As an example, let us consider a configuration in which an amplifying MOS transistor is used in common for two pixels and a well contact is not used, as described in EP1017106. In such case, a long time is required for stabilizing the substrate potential in order to increase the drive rate at the readout operation, so that a high-speed readout is difficult to achieve.

Also a well contact, in case formed for each pixel, results in a corresponding decrease of the photodiode area, thereby reducing the effect of using the pixels in common.

It is therefore possible to form a well contact for plural pixels, and to adopt the configuration of the present embodiment in order to solve the drawback of a difference in the dark currents between the pixel rows (rows of photodiodes).

Figure 4:
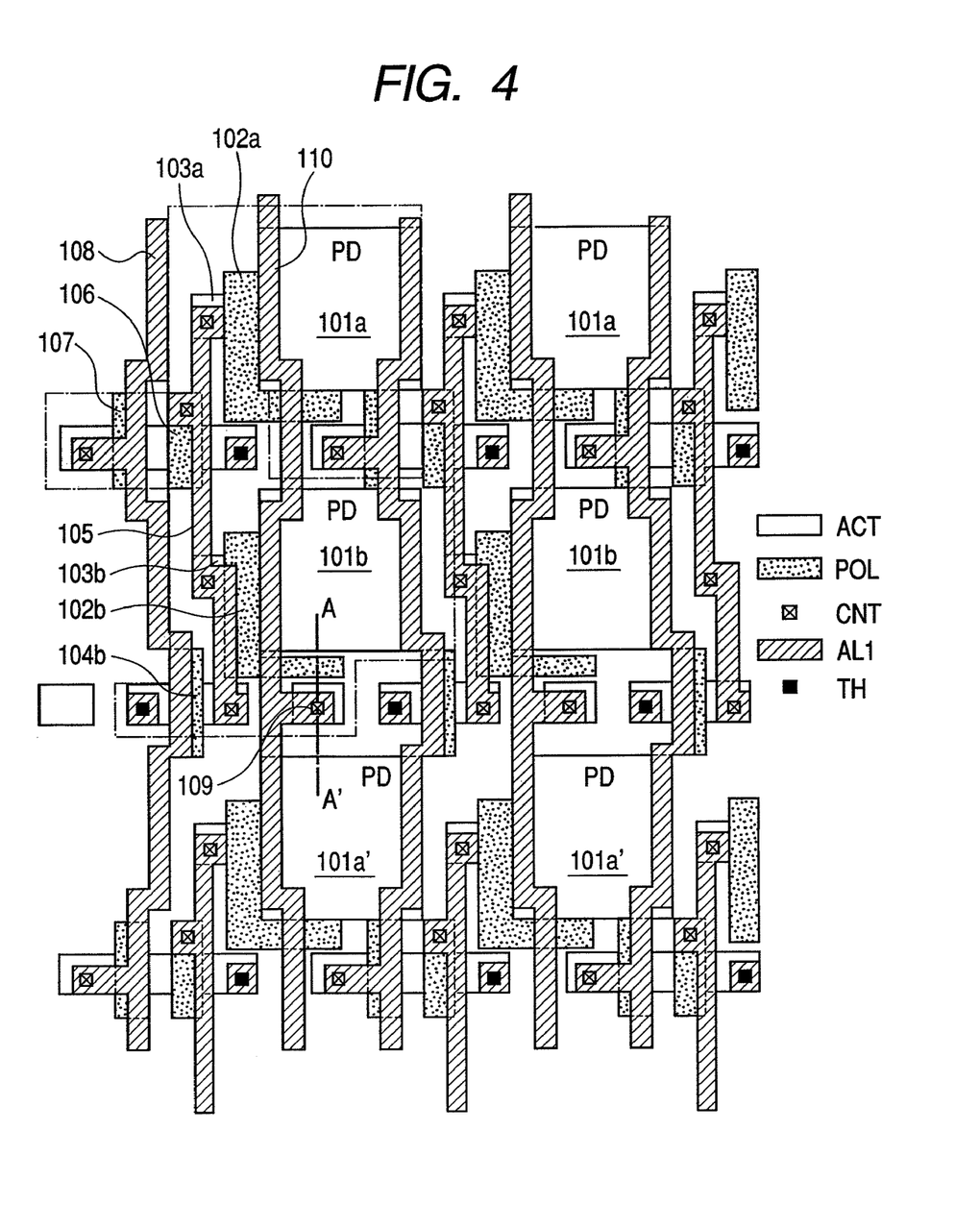
FIG. 4 is a plan view of a first example of a solid-state image pickup apparatus of the present invention.
Figure 8:
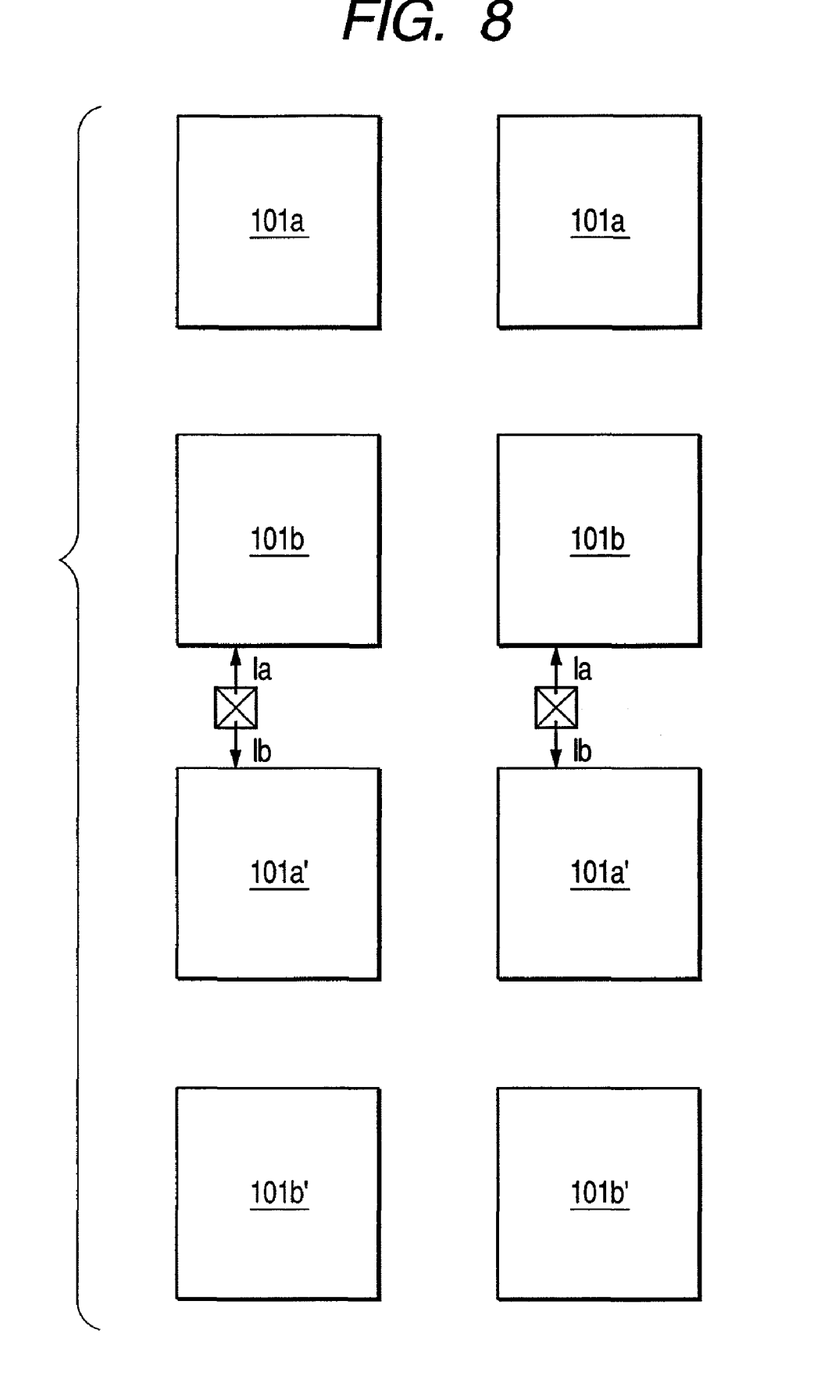
FIG. 8 is a plan view of a solid-state image pickup apparatus of the present invention.

It is also possible, as shown in FIG. 8, to form a first group by pixels 101a, 101b having a common amplifying MOS transistor, and a second group by pixels 101a', 101b' having a common amplifying MOS transistor. A well contact is provided between the pixels of the first group and the adjacent pixels of the second group. Thus, it may be provided in a first semiconductor region (well region), between the second semiconductor region in the first group and the second semiconductor region in the second group, adjacent to the second semiconductor region in the first group. Particularly in a configuration in which an amplifying MOS transistor is used in common by plural pixels as shown in FIG. 4, it is preferably formed between the pixels 101b and 101a' of the adjacent groups, in consideration of ease of layout. FIG. 4 shows an example in which the amplifying MOS transistor are used in common for two pixels which form a group, but it is also possible to use the amplifying MOS transistor in common for three or more pixels and to form a group by such three or more pixels. In such case, the well contact may be provided not only between the groups but also within a group.

As explained in the foregoing, the present invention is to reduce or eliminate a difference in the dark currents between adjacent photoelectric conversion elements, and is applicable to an image pickup apparatus having a well contact or a substrate contact between two photoelectric conversion elements, and more specifically to a line sensor in which photoelectric conversion elements are one-dimensionally arranged, or to an area sensor in which photoelectric conversion elements are two-dimensionally arranged.

Examples of the present invention will be explained in the following.

Example 1

FIG. 4 is a plan view of a first example of the present invention. In FIG. 4, there are shown a photodiode (semiconductor layer) PD, an active region ACT, a polysilicon layer POL, a contact hole CNT, a first metal layer AL1 such as of aluminum, and a through hole TH.

In FIG. 4, there are shown N-semiconductor layers 101a, 101b, 101a' constituting carrier accumulation layers of photodiode for photoelectric conversion; gate electrodes 102a, 102b of transfer MOS transistors for reading signal charges from photodiodes (N-semiconductor layers) 101a, 101b; drain regions 103a, 103b (constituting floating diffusion regions (FD)) of the transfer MOS transistors; a gate electrode 104 of a reset transistor for resetting the photodiode (N-semiconductor layer) and the FD region, and a gate electrode 106 of an amplifying MOS transistor constituting a source follower amplifier for converting the read charge into a voltage. The gate electrode of the amplifying MOS transistor and the FD regions 103a, 103b are connected by a wiring 105. A gate electrode 107 of a row selecting MOS transistor selectively outputs, to a signal line 108, an output of the amplifying MOS transistor constituting a source follower amplifier. A well contact 109 provided in the pixel region is fixed at a constant potential, for example a ground potential, through a power supply wiring 110 (connected to a fixed voltage source (including a case of grounding)). In FIG. 4, an area surrounded by a chain line indicates a pixel unit constituted of two photodiodes, two transfer MOS transistors, two FD regions, an amplifying MOS transistor, a reset MOS transistor and a selecting MOS transistor. The two photodiodes constitute a group, and m groups are formed in case the photodiodes are provided in a number 2 m (m being a natural number equal to or larger than 1) in the row direction. In case a group is formed by four photodiodes, there are formed m/2 groups in case the photodiodes are provided in a number 2 m (m being a natural number equal to or larger than 2) in the row direction. A pixel unit is constituted by providing a transfer MOS transistor for each photodiode, and providing a reset MOS transistor and a selecting MOS transistor for each group of the photodiodes. One pixel unit is provided with plural photodiodes and includes plural pixels.

Figure 5:
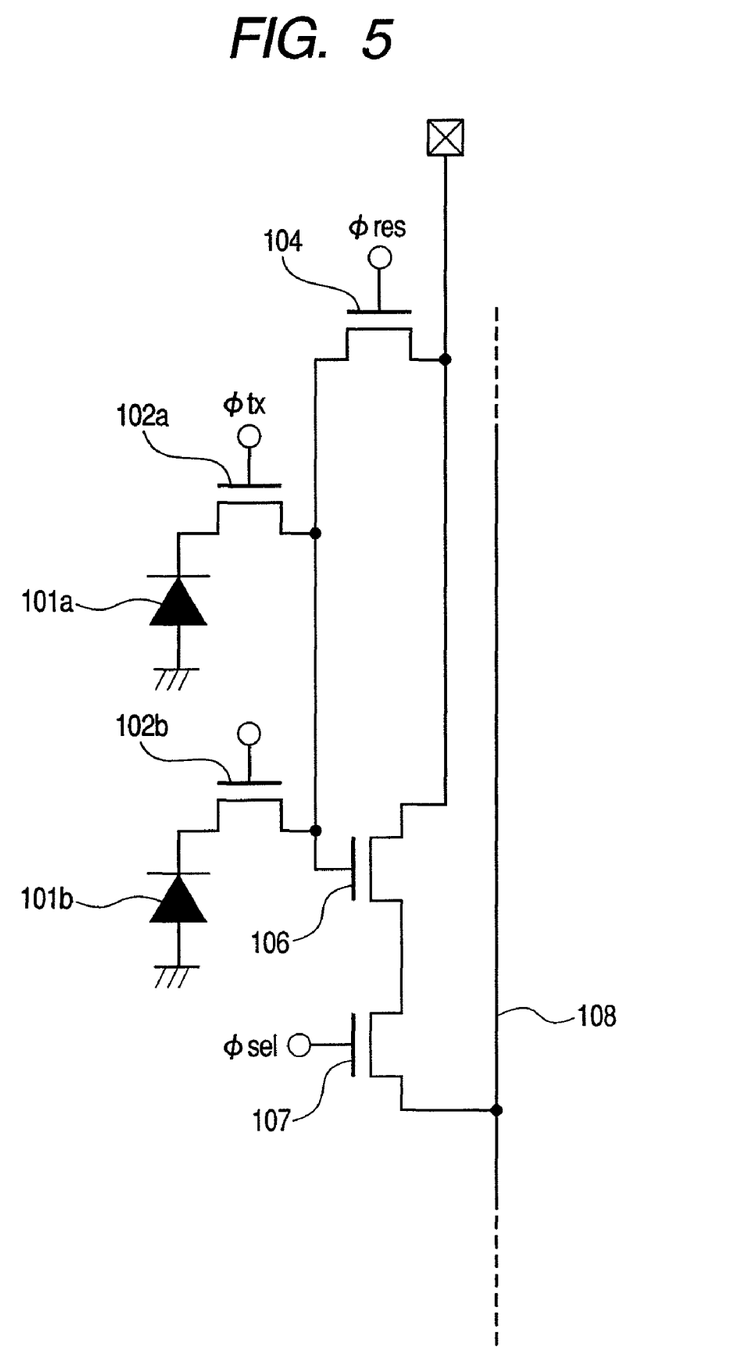
FIG. 5 is an equivalent circuit diagram of a pixel unit surrounded by a broken line in FIG. 4.

FIG. 5 is an equivalent circuit diagram of the pixel unit surrounded by a broken line in FIG. 4. In FIG. 5, 101a and 101b do not indicate the semiconductor regions but photodiodes themselves, and 102a, 102b, 104, 106 and 107 do not indicate the gate electrodes but respectively indicate a transfer MOS transistor, a reset MOS transistor, an amplifying MOS transistor and a selecting MOS transistor themselves. Photodiodes 101a, 101b are connected to an FD region 103, respectively through transfer MOS transistors 102a, 102b. A backgate potential of all the transistors and anode electrodes of the photodiodes are fixed to a constant potential, such as a ground potential, through the well contact 109. Also a drain of the reset transistor 104 and a drain of the source follower amplifier are fixed to the power supply voltage through a via hole.

FIG. 1 corresponds to a cross section at A-A' in FIG. 4. Portions similar to those in the cross-sectional configuration of the first embodiment will be omitted from the following explanation. In FIG. 1, the conductive layer is constituted of a gate electrode of the transfer transistor 102b, but it may also be constituted of a gate electrode 107 of the selecting MOS transistor, a gate electrode 104 of the resetting MOS transistor or a gate electrode of the amplifying MOS transistor.

A side wall 308 is formed before an ion implantation for forming a high-concentration diffusion area ($N^{++}$ or $P^{++}$ region) constituting the source-drain of the MOS transistor. A well contact 108 fixed the potential of the P-type well 302 through a $P^{++}$ diffusion region 306.

As already explained in the embodiments, and as indicated by a potential distribution in a portion X-X' in FIG. 2, electrons constituting the minority carriers are present at a higher concentration than in other regions. A part of such electrons may be fetched in the photodiode of a low potential, thereby resulting in an increased dark current.

In contrast in the present example, as shown in FIG. 1, the semiconductor region 306 of the well contact and the channel stop region 307b are connected, and a $P^+$ region of a high concentration is formed from the high-concentration $P^{++}$ region 306 through the channel stop region 307b to the N-type charge accumulation region 101b. Therefore, the electrons constituting the minority carriers are maintained at a low concentration, thereby allowing to reduce the dark current.

In order to avoid a potential pocket as shown in FIG. 2, a distance a between an end of the element isolation region 303b at the side of the $P^{++}$ region 306 and an end of the polysilicon conductive layer 304 at the side of the $P^{++}$ region 306 is made same as or larger than a width b of the side wall 308. Also the distance a is made smaller than a device isolating width c. Such structure can be also a structure in which the side wall is present on the element isolation region and an external end of the side wall does not exceed an end of the element isolation region.

Figure 6:
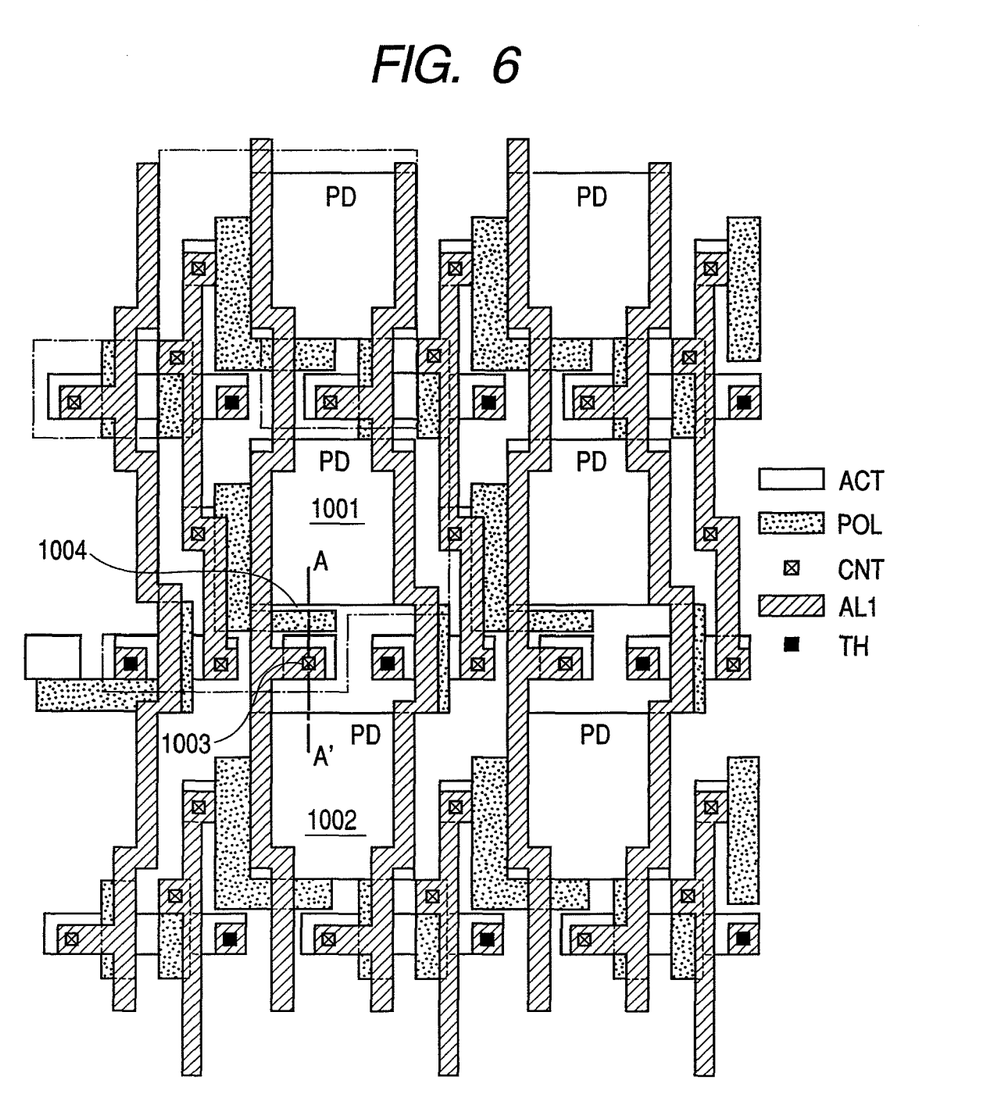
FIG. 6 is a plan view of comparative examples of a photoelectric conversion apparatus and a solid-state image pickup apparatus of the present invention.

FIG. 6 is a plan view of a solid-state image pickup apparatus, corresponding to the Comparative Example shown in FIG. 2. FIG. 2 corresponds to a cross section along a line A-A' in FIG. 6. Referring to FIG. 6, a well contact region 1003 is provided between two photodiodes 1001 and 1002. Also a polysilicon wiring 1004 is provided between the photodiodes 1001 and 1003.

A cross-sectional configuration is same as that shown in FIG. 2.

Also, wide wall layers 1107, 1108 are formed on both sides of the polysilicon wiring 1004. Such side wall layers are formed in a bi-product manner at the formation of MOS transistors in the image pickup apparatus.

A pixel in the present example includes a photodiode, a transfer MOS transistor, an amplifying MOS transistor, a reset MOS transistor, and a selecting MOS transistor, and the amplifying MOS transistor is used in common for plural photodiodes and plural transfer MOS transistors. In the present invention, each transistor is not limited to a MOS transistor, and there can also be employed VMIS (threshold voltage modulation image sensor), BCAST (buried charge accumulator and sensing transistor array) or LBCAST (lateral buried charge accumulator and sensing transistor array). In particular, BCAST or LBCAST can be realized without a substantial change, by replacing a JFET transistor with an amplifying MOS transistor. Also a sensor of a type, in which a signal charge accumulated in a photoelectric conversion portion is guided to a control electrode of a transistor provided in the pixel and an amplified signal is outputted from a main electrode, may be employed in the pixel of the present embodiment. There can also be utilized an SIT image sensor utilizing an SIT as the amplifying transistor (A. Yusa, J. Nishizawa et al., "SIT image sensor: Design consideration and characteristics", IEEE trans., Vol. ED-33, pp. 735-742, June 1986), BASIS utilizing a bipolar transistor (N. Tanaka et al., "A 310K pixel bipolar imager (BASIS)", IEEE Trans. Electron Devices, vol. 35, pp. 646-652, May 1990), or CMD utilizing JFET with depleted control electrode (Nakamura et al., "gate accumulation MOS phototransistor image sensor", Bulletin of Television Society, 41, 11, pp. 1085-1082, November 1987). Also the arrangement of the photoelectric conversion elements may assume a honeycomb structure.

The present example shows a configuration in which the amplifying MOS transistor is used in common for plural photodiodes, and the selecting MOS transistor and the reset MOS transistor are also used in common for plural pixels. However the present invention is likewise applicable to a case where each pixel is provided with an amplifying MOS transistor, a selecting MOS transistor and a reset MOS transistor. Also the present invention is applicable, if necessary, to a configuration which is not provided with a selecting MOS transistor and in which a pixel is selected by controlling a potential of an FD region for example by a reset transistor. The wiring layer may be utilized in a gate electrode 102a of a transfer MOS transistor 102b, a gate electrode 107 of a selecting MOS transistor, a gate electrode 104 of a reset MOS transistor or a gate electrode 106 of an amplifying MOS transistor.

Example 2

Figure 7:
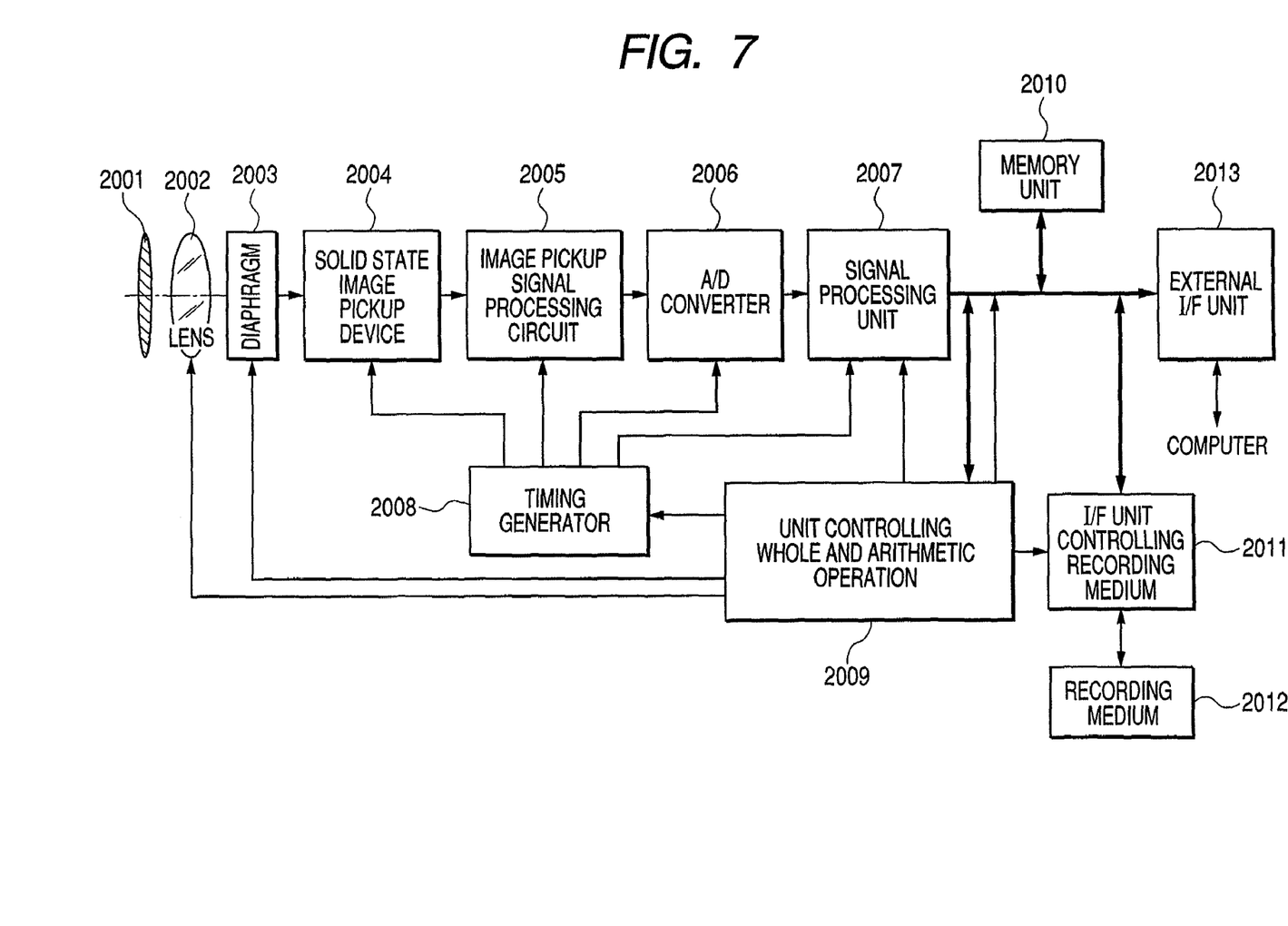
FIG. 7 is a configurational view employing, as a solid-state image pickup apparatus of the present invention, a solid-state image pickup apparatus utilizing a photoelectric conversion apparatus of the embodiments or a solid-state image pickup apparatus of Example 1.

FIG. 7 shows a configuration of a solid-state image pickup system of the present invention, employing a solid-state image pickup apparatus of the present invention. The image pickup system is constituted of a barrier 2001 serving for lens protection and as a main switch; a lens 2002 for focusing an optical image of an object on a solid-state image pickup device 2004; a diaphragm 2003 for varying a light amount passing through the lens 2002; a solid-state image pickup device 2004 for fetching the object, focused by the lens 2002, as an image signal (corresponding to an image pickup apparatus explained in the foregoing embodiments); an image pickup signal processing circuit 2005 for executing various corrections and a clamping on the image signal outputted from the solid-state image pickup device 2004; an A/D converter 2006 for executing an analog/digital conversion on the image signal outputted from the solid-state image pickup device 2004; a signal processing unit 2007 for executing various corrections and a data compression on the image data outputted from the A/D converter 2006; and a timing generator 2008 for outputting various timing signals to the solid-state image pickup device 2005, the image pickup signal processing circuit 2005, the A/D converter 2006 and the signal processing unit 2007. The circuits 2005-2008 may be formed on the same chip of the solid-state image pickup device 2004. The solid-state image pickup system further includes a whole-control/arithmetic operation unit 2009 for executing various calculations and controlling the entire still video camera; a memory unit 2010 for temporarily storing image data; a recording medium control interface 2011 for executing a recording or a readout into or from the recording medium; a detachable recording medium 2012 such as a semiconductor memory for data recording or readout; and an external interface (I/F) 2013 for communication with an external computer or the like.

In the following there will be explained operations of the system shown in FIG. 7. When the barrier 2001 is opened, a main power supply is turned on, then a power supply for the control system is turned on and a power supply for the image pickup circuits such as the A/D converter 2006 is turned on. Then, in order to control an exposure amount, the whole-control/arithmetic operation unit 2009 fully opens the diaphragm 2003, and a signal outputted from the solid-state image pickup device 2004 is passed through the image pickup signal processing circuit 2005 and outputted to the A/D converter 2006. The A/D converter 2006 executes an A/D conversion on the signal for supply to the signal processing unit 2007. Based on such data, the signal processing unit 2007 calculates an exposure amount by the whole-control/arithmetic operation unit 2009.

A luminance is judged from the result of such light metering, and the whole-control/arithmetic operation unit 2009 controls the diaphragm based on such result. Then, based on the signal outputted from the solid-state image pickup device 2004, the whole-control/arithmetic operation unit 2009 extracts a high-frequency component and calculates a distance to the object. Thereafter it drives the lens 2002 and judges whether it is in an in-focus state, and, if not in focus, it again drives the lens 2002 and executes a distance calculation.

Then a main exposure is initiated after an in-focus state is confirmed. When the exposure is completed, an image signal outputted from the solid-state image pickup device 2004 is subjected to a correction in the image pickup signal processing circuit 2005, then to an A/D conversion by the A/D converter 2006, then passed by the signal processing unit 2007 and accumulated by the whole-control/arithmetic operation unit 2009 in the memory unit 2010. Then the data accumulated in the memory unit 2010 are passed, under the control of the whole-control/arithmetic operation unit 2009, by the recording medium control I/F 2011 and recorded in the detachable memory medium 2012 such as a semiconductor memory. The data may also be supplied through the external I/F 1013 directly to a computer or the like for image processing.

The present invention is applicable to a solid-state image pickup apparatus, and a solid-state image pickup system utilizing the same, such as a digital camera, a video camera, a copying apparatus or a facsimile apparatus.

This application claims priority from Japanese Patent Application No. 2004-254360 filed Sep. 1, 2004, which is hereby incorporated by reference herein.

What is claimed is:

1. An image pickup apparatus comprising:
a photoelectric conversion element, which includes a first semiconductor region of a first conductivity type and a second semiconductor region of a second conductivity type forming a junction with the first semiconductor region;
a floating diffusion region of the second conductivity type, to which an output signal from the photoelectric conversion element is transferred;
a third semiconductor region of the first conductivity type, which has an impurity concentration higher than that of the first semiconductor region and which is arranged in the first semiconductor region, wherein the third semiconductor region is connected to a conductor that defines the potential of the first semiconductor region;
an element isolation region, formed from an insulator, and provided between the third semiconductor region and the second semiconductor region;
a conductive layer provided on the element isolation region;
a channel stop region of the first conductivity type, which is arranged under the element isolation region, wherein the channel stop region is laterally connected or contacted to the third semiconductor region, not through the first semiconductor region; and
a side wall spacer positioned at a side of the conductive layer, such that a width c of the element isolation region, a width b of the side wall spacer, and a distance a between an end of the element isolation region at a side of the third semiconductor region and an end of the conductive layer at the side of the third semiconductor region satisfy a relation $c > a \geq b$.

2. An image pickup apparatus according to claim 1, wherein the image pickup apparatus is incorporated in an image pickup system that includes:
an optical system for focusing light onto the image pickup apparatus, and
a signal processing circuit for processing the output signal from the image pickup apparatus.

3. An image pickup apparatus comprising:
a photoelectric conversion element, which includes a first semiconductor region of a first conductivity type and a second semiconductor region of a second conductivity type forming a junction with the first semiconductor region;
a floating diffusion region of the second conductivity type, to which an output signal from the photoelectric conversion element is transferred;
a third semiconductor region of the first conductivity type, which has an impurity concentration higher than that of the first semiconductor region and which is arranged in the first semiconductor region, wherein the third semiconductor region is connected to a conductor that defines the potential of the first semiconductor region;
an element isolation region, formed from an insulator, and provided between the third semiconductor region and the second semiconductor region;
a conductive layer provided on the element isolation region;
a channel stop region of the first conductivity type, which is arranged under the element isolation region, wherein the channel stop region is laterally connected or contacted to the third semiconductor region, not through the first semiconductor region; and
a side wall spacer positioned at a side of the conductive layer, the side wall spacer being provided on the element isolation region in such a manner that an external end of the side wall spacer does not exceed an end of the element isolation region, and such that the side wall spacer is used as a mask for forming the third semiconductor region.

4. An image pickup apparatus according to claim 3, further comprising a transfer transistor for transferring carriers accumulated in the second semiconductor region, wherein the conductive layer constitutes a part of a gate electrode of the transfer transistor.

5. An image pickup apparatus according to claim 3, further comprising:
a transfer transistor provided for the second semiconductor region for transferring carriers accumulated in the second semiconductor region to the floating diffusion region;

an amplifying transistor of which a gate electrode is connected with the floating diffusion region;

a selecting transistor; and a reset transistor for resetting at least a potential of the floating diffusion region, wherein the conductive layer constitutes a part of a gate electrode of the transfer transistor, the gate electrode of the amplifying transistor, a gate electrode of the selecting transistor, or a gate electrode of the reset transistor.

6. An image pickup apparatus according to claim 3, wherein the image pickup apparatus includes plural second semiconductor regions and one or more third semiconductor regions, the plural second semiconductor regions are arranged one dimensionally or two dimensionally, such that second semiconductor regions arranged along a direction form a group by every predetermined number, and such that a third semiconductor region is provided for each group, the third semiconductor region is provided in the first semiconductor region between the second semiconductor regions that are at least partially adjacent within a group, element isolation regions are respectively provided between the third semiconductor region and the second semiconductor region, and the conductive layer is provided on at least one of the element isolation regions.

7. An image pickup apparatus according to claim 3, wherein the image pickup apparatus includes plural second semiconductor regions, the plural second semiconductor regions are arranged one dimensionally or two dimensionally, such that the plural second semiconductor regions arranged along a direction form a group by every predetermined number, the third semiconductor region is provided in the first semiconductor region between a second semiconductor region in a first group and a second semiconductor group in a second group adjacent to the first group, element isolation regions are provided respectively between the third semiconductor region and the second semiconductor regions of the first and second groups adjacent to the third semiconductor region, and the conductive layer is provided on at least one of the element isolation regions.

8. An image pickup apparatus according to claim 7, further comprising, for each second semiconductor region, a transfer transistor for transferring carriers accumulated in the second semiconductor region, wherein the conductive layer constitutes a part of a gate electrode of the transfer transistor.

9. An image pickup apparatus according to claim 7, further comprising:

a transfer transistor provided for each second semiconductor region for transferring carriers accumulated in the second semiconductor region to the floating diffusion region;

an amplifying transistor of which a gate electrode is connected with the floating diffusion region;

a selecting transistor connected to the amplifying transistor; and a reset transistor for resetting at least the floating diffusion region, wherein the conductive layer constitutes a part of a gate electrode of the transfer transistor, the gate electrode of the amplifying transistor, a gate electrode of the selecting transistor, or a gate electrode of the reset transistor.

10. An image pickup apparatus according to claim 9, wherein an amplifying transistor is provided commonly for each group.

11. An image pickup apparatus according to claim 3, wherein the image pickup apparatus is incorporated in an image pickup system that includes:

an optical system for focusing light onto the image pickup apparatus, and a signal processing circuit for processing an output signal from the image pickup apparatus.

* * * * *